United States Patent [19]
Hur et al.

[11] Patent Number: 5,272,102
[45] Date of Patent: Dec. 21, 1993

[54] METHOD OF MAKING SEMICONDUCTOR MEMORY DEVICE AND MEMORY CELLS THEREFOR

[75] Inventors: Hun Hur; Jae S. Jeong, both of Seoul, Rep. of Korea

[73] Assignee: GoldStar Electron Co., Ltd., Seoul, Rep. of Korea

[21] Appl. No.: 930,938

[22] Filed: Aug. 14, 1992

[30] Foreign Application Priority Data

Aug. 14, 1991 [KR] Rep. of Korea ............... 14048/1991
Oct. 17, 1991 [KR] Rep. of Korea ............... 18278/1991

[51] Int. Cl.⁵ .......................................... H01L 21/70
[52] U.S. Cl. ..................................... 437/52; 437/47; 437/60; 437/919
[58] Field of Search ................. 437/47, 48, 52, 60, 437/919; 257/301, 302

[56] References Cited

U.S. PATENT DOCUMENTS

4,649,625 3/1987 Lu ........................................ 437/52
4,988,637 1/1991 Dhong et al. ....................... 437/919
5,013,680 5/1991 Lowrey et al. ..................... 437/919

FOREIGN PATENT DOCUMENTS

261165 12/1985 Japan .

OTHER PUBLICATIONS

A Surrounding Gate Transister (SGT) Cell for 64/256Mbit DRAMS by: K. Sunouchi, et al. 24-IEDM 89; pp. 23-26.

Double LDD Concave (DLC) Structure for Sub-Half Micron Mosfet by: K. Sunouchi, et al. IEDM 88-227; pp. 226-229.

Primary Examiner—Tom Thomas
Attorney, Agent, or Firm—Alan R. Loudermilk

[57] ABSTRACT

Methods of making semiconductor memory cells and semiconductor memory devices capable of improving the degree of integration and simplifying the overall manufacturing processes. Within a substrate made of a semiconductor material or an insulating material, at least one trench is formed to provide a capacitor region. In the trench are formed a plate electrode, a capacitor dielectric layer and a storage node electrode which constitute a capacitor. The semiconductor substrate may be used as the plate electrode. In this case, the trench has only the capacitor dielectric layer and the storage node electrode. At the inlet of the trench filled with the constituting elements of the capacitor, a gate electrode and a semiconductor layer as an active layer are formed to extend vertically perpendicular to the trench inlet. A bit line contact is formed on the semiconductor layer. Over the bit line contact are formed a bit line contact and a bit line, in this order.

70 Claims, 18 Drawing Sheets

F I G. 6b
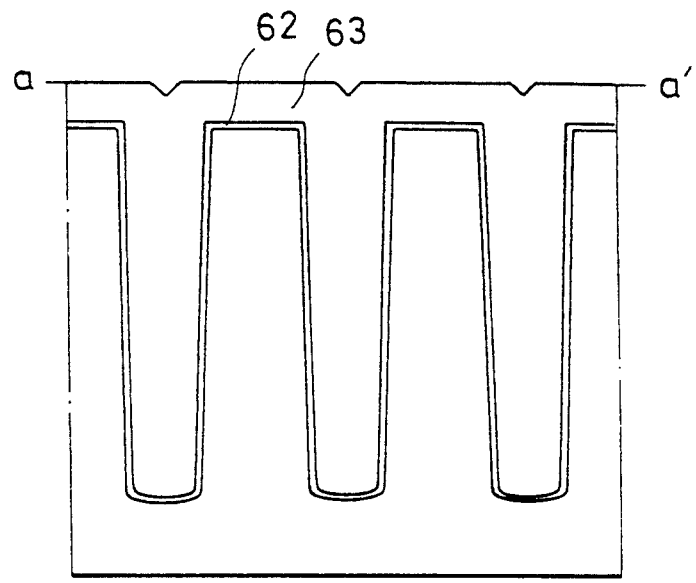
F I G. 6c
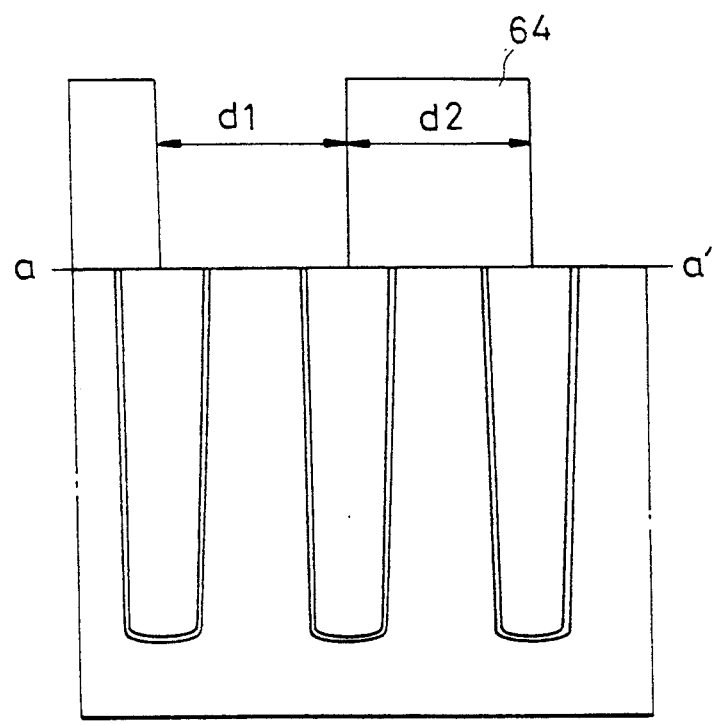

METHOD OF MAKING SEMICONDUCTOR MEMORY DEVICE AND MEMORY CELLS THEREFOR

BACKGROUND OF THE INVENTION

1. Field of the Invention

The present invention relates to methods of making semiconductor memory devices and memory cells for such devices, and more particularly to methods of making dynamic type semiconductor memory devices such as dynamic random access memory devices and memory cells for such devices.

2. Description of the Prior Art

Dynamic random access memory (DRAM) cells are widely used for memory elements, since they can be integrated in a highly dense manner. As is well-known, such DRAMs have only one capacitor and one switching transistor connected with the capacitor in each memory cell.

However, the degree of integration of DRAMs has recently quadrupled every three years and this tendency seems to be continuing. Although the memory capacity increases four times, the chip size increases only about two times by virtue of highly sophisticated processing technology.

However, the capacitance of a capacitor in a memory cell, which is a location for storing information in the form of millions of electrons, cannot be reduced with subsequent generations due to the operational characteristics of DRAM circuits. Most currently commercial products should be designed to have a capacitance value of about 20 femto Farad or larger per cell. In order to reduce the area per cell and yet maintain the capacitance of the capacitor, most commercial DRAMs having the integration degree of 4-mega-bits or greater use three-dimensional capacitors.

A conventional structure of a DRAM device including a three-dimensional capacitor will be now described in conjunction with FIG. 1.

In accordance with a conventional method, active and field regions are defined in P type semiconductor substrate 1. The definition of these regions is achieved by implanting channel stop ions into a desired portion of semiconductor substrate 1 to grow partially a field region, which is denoted by the reference numeral "2" in FIG. 1.

Over semiconductor substrate 1 are deposited gate insulating film 3a, polysilicon film 3b for a gate and gate cap insulating film 3c, in this order. By photo and dry etching processes, gate electrodes 3b are then formed on the active region and field region 2, respectively, as indicated. Thereafter, low concentration N type (N⁻ type) ions are implanted in P type semiconductor substrate 1, so as to form low concentration source and drain regions Over the resultant entire exposed surface, an insulating film is deposited which is, in turn, subjected to patterning for forming gate side walls 4. Subsequently, high concentration N type (N+ type) ions are implanted in side walls 4 so that source and drain regions with a lightly doped drain (LDD) structure are formed.

Over the resultant entire exposed surface, another insulating film is deposited which is, in turn, subjected to photo and etching processes and steps to form a buried contact and a storage node electrode as indicated. Over the storage node electrode, which is denoted by the reference numeral "6" in FIG. 1, are deposited capacitor dielectric film 7 and plate electrode 8, in this order. Capacitor dielectric film 7 and plate electrode 8 are then subjected to photo and etching processes so that their unnecessary portions are removed for producing a capacitor.

Over the resultant entire exposed surface, thereafter, insulating film 9 is deposited. Insulating film 9 is then subjected to photo and etching processes to form a bit line contact. Subsequently, bit line 10 is deposited over the resultant entire exposed surface.

The characteristic of the above-described structure is that a capacitor is provided even over a word line, thereby resulting in an increase in the capacitor surface area.

As mentioned above, the area occupied by each DRAM cell is gradually reduced in subsequent generation devices, resulting in a great reduction in the amount of electric charge to be stored in each capacitor. As a result, the content of some of the DRAM cells may be erroneously read. In this regard, it is required to provide a method of making a stacked capacitor capable of increasing the capacitor surface area. U.S. Pat. No. 4,970,564 (issued to Hitachi Ltd. in Japan) discloses a semiconductor memory device having three-dimensional stacked capacitor cells capable of increasing the capacitor surface area without increasing the capacitor height.

The method disclosed in U.S. Pat. No. 4,970,564 will now be described in conjunction with FIGS. 2a to 2i.

In accordance with this method, well 12 of a predetermined conductivity type (in a complementary metal oxide semiconductor or "CMOS" device, P type well and N type well) is first formed on silicon substrate 11, as shown in FIG. 2a. Active regions 13 and field regions 14 are then formed on silicon substrate 11 by using the improved LOCOS (local oxidation of silicon) method. Thereafter, gate insulating film 15 is formed on active regions 13.

As illustrated in FIG. 2b, word lines 16 and insulating films 17 for insulating adjacent layers from each other are then formed on gate insulating film 15 by using a well-known low pressure chemical vapor deposition (LPCVD) method and a well-known anisotropic dry etching method. Over the entire exposed surface of silicon substrate 11, insulating film 18 is then formed by using a chemical vapor deposition (CVD) method. First contact hole 30 is formed in insulation film 18 above first impurity diffusion region 19, which is located in an active region of a switching transistor such as is present in memory cells and will be electrically connected to a bit line, as illustrated in FIG. 2c. Thereafter, bit lines 20 and insulating film 21 are formed using LPCVD and dry etching methods, as illustrated in FIG. 2d. Bit line 20 is isolated from a layer which will be subsequently formed thereon, by using a conventional method forming side wall insulating film 22, as shown in FIG. 2e. Thereafter, another insulating film 23 is formed. In insulating film 23, second contact holes 29 are formed above each second impurity diffusion region 24, which is located in active region 13 of a switching transistor such as is present in every memory cell and will be electrically connected to a stacked capacitor, as illustrated in FIG. 2f. Storage electrode 25 is then formed by using LPCVD and dry etching methods, as shown in FIG. 2g. Storage electrode 25 is one of two electrodes of the stacked capacitor and will be connected to second impurity diffusion regions 24. Thereafter, dielectric film 26 for the stacked capacitor is formed.

As shown in FIG. 2h, plate electrode 27 of the stacked capacitor is then formed by using LPCVD and dry etching methods. Another insulating film 28 also is formed using a CVD method, as shown in FIG. 2i. Insulating film 28 functions to electrically insulate the stacked capacitor from metal wiring that will be formed thereon. Although not shown, additional contact holes are to be formed at proper positions. Also, metal wiring for connecting circuits are covered over the stacked capacitors by using sputtering or CVD methods and then defined by using an anisotropic dry etching method.

This DRAM cell having the above-mentioned structure of a stacked capacitor is very advantageous in extending the area of the capacitor in that the storage node electrode of the stacked capacitor can be positioned even above the contact hole connecting the bit line and a diffusion region of the switching transistor because the stacked capacitor is formed after the formation of bit lines as well as the formation of word lines, that is, gate electrodes. Accordingly, the memory cell having the improved structure of stacked capacitors can be advantageously used in DRAMs having a high degree of integration.

However, DRAM cells having the above-mentioned conventional structures having the following problems.

First, in the case of a DRAM cell having the stack capacitor structure shown in FIG. 1, the capacitor surface area can be increased by increasing the capacitor height. However, such an increase in the capacitor height has a limitation, namely because increasing the capacitor height tends to make the manufacture difficult. Furthermore, since the second impurity diffusion region, which is the junction region between the word line and the capacitor, is arranged horizontally in parallel to the first impurity diffusion region, which is the junction region between the bit line and the capacitor, it is impossible to obtain a sufficient capacitor surface area within the area per DRAM cell, which area again is limited by the desired high integration degree of the DRAM device.

Second, in case of a DRAM cell having a stack capacitor structure as shown in FIG. 2, there is an advantage that the capacitor surface area can be increased without an increase in capacitor height, as compared with the DRAM cell of FIG. 1. This is because a capacitor is laid even above the junction region of each bit line. With the DRAM structure of FIG. 2, however, the junction region between the word line and the capacitor is still arranged horizontally in parallel to the junction region between the bit line and the capacitor, as with the DRAM structure of FIG. 1. As a result, it is impossible to obtain a sufficient capacitor surface area within the area per DRAM cell, which area is limited by the desired high integration degree of the DRAM device. The DRAM structure of FIG. 2 also has the disadvantage in that the stack capacitor structure tends to make the manufacture difficult.

SUMMARY OF THE INVENTION

Therefore, an object of the present invention is to eliminate the above-mentioned disadvantages encountered in the prior art and to provide a method of making a semiconductor memory cell capable of reducing the occupying area without a reduction in memory capacitor surface area.

Another object of the present invention is to provide a method of making a semiconductor memory device capable of improving the integration degree without a reduction in memory capacitor surface area.

In one aspect, the present invention provides a method of making a semiconductor memory cell comprising the steps of: preparing a semiconductor substrate of a first conductivity type as a plate electrode for a capacitor; forming a trench having an inlet in the first conductivity type semiconductor substrate, the trench having a predetermined depth from the upper surface of the semiconductor substrate; forming a capacitor dielectric layer and a conductive material layer of a second conductivity type as a storage node electrode, in this order, over the surface of the trench, the layers filling the trench; forming a semiconductor layer as an active layer over a part of the surface of the semiconductor substrate and a part of the inlet of the trench, the semiconductor layer having opposite side walls; implanting impurity ions of the second conductivity type in the surface of the semiconductor layer to form a bit line junction region having a predetermined depth; forming a first insulating layer for providing an insulation of a gate electrode, over the other inlet part of the trench not covered with the semiconductor layer and on one side wall of the semiconductor layer neighboring with the other inlet part of the trench; forming a side wall gate electrode over the first insulating layer such that it extends vertically perpendicular to the inlet of the trench and along the one side wall of the semiconductor layer; forming a second insulating layer over the resultant entire exposed surface and patterning the second insulating layer to form a bit line contact at the bit line junction region; and forming a bit line over the bit line contact.

In another aspect, the present invention provides a method of making a semiconductor memory device comprising the steps of: preparing a semiconductor substrate of a first conductivity type as a plate electrode for a capacitor; forming a plurality of uniformly spaced trench pairs in the first conductivity type semiconductor substrate, each trench pair including a pair of spaced trenches each having an inlet and a predetermined depth from the upper surface of the semiconductor substrate; forming a capacitor dielectric layer and a conductive material layer of a second conductivity type as a storage node electrode, in this order, over the surface of each trench, the layers filling each trench; forming a first insulating layer over the resultant entire exposed surface and removing portions of the first insulating layer each disposed over a region extending from a part of one of the adjacent trenches to a part of the other adjacent trench in a direction that bit lines extend, each portion to be removed having a width corresponding to a predetermined width of each bit line; forming a semiconductor layer as an active layer over regions corresponding to the removed portions of the first insulating layer and removing selectively the remaining portions of the first insulating layer, the semiconductor layer comprising a plurality of portions each corresponding to each of the regions and having opposite side walls; implanting high concentration impurity ions of the second conductivity type in the surface of the semiconductor layer to form a bit line junction region having a predetermined depth at the upper part of each semiconductor layer portion; forming a second insulating layer for providing an insulation of each gate electrode over the other inlet part of each trench not covered with the semiconductor layer and on the side walls of each semiconductor layer portion; forming a side wall gate electrode over the second insulating layer such that it extends vertically perpendicular to the inlet of each corresponding trench and along side walls of each semiconductor layer portion; forming a third insulating layer over the resultant entire exposed surface and patterning the third insulating layer to form a bit line contact at each bit line junction region; and forming a bit line over each bit line contact.

In another aspect of the present invention, at least one trench is formed in a substrate made of an insulating material or a semiconductor material. In the trench are formed a plate electrode, a capacitor dielectric layer and a storage node electrode which constitute a capacitor. The semiconductor substrate may be used as the plate electrode. In this case, the trench has only the capacitor dielectric layer and the storage node electrode. At the inlet of the trench filled with the constituting elements of the capacitor, a gate electrode and a semiconductor layer as an active layer are formed to extend perpendicularly to the trench inlet. A bit line contact is formed at the semiconductor layer. Over the bit line contact are formed a bit line contact and a bit line, in this order.

In the obtained DRAM cell and DRAM device, constituting elements are arranged vertically, resulting in the achievement of a high degree of integration in the memory device.

BRIEF DESCRIPTION OF THE DRAWINGS

Other objects and aspects of the invention will become apparent from the following description of embodiments with reference to the accompanying drawings in which:

FIGS. 6a to 6h are cross-sectional views taken along line a—a' of FIG. 5;

DETAILED DESCRIPTION OF THE PREFERRED EMBODIMENTS

Referring to FIGS. 3a to 9b, there are illustrated several embodiments of the present invention which will be described hereinafter.

First Embodiment

Figure 1:
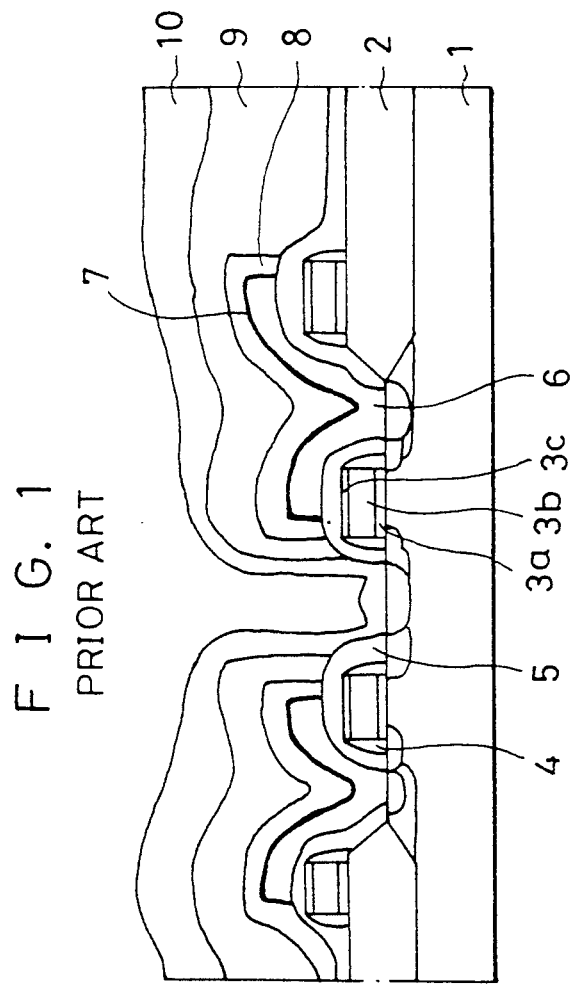
FIG. 1 is a sectional view of a conventional DRAM device.
Figure 2A:
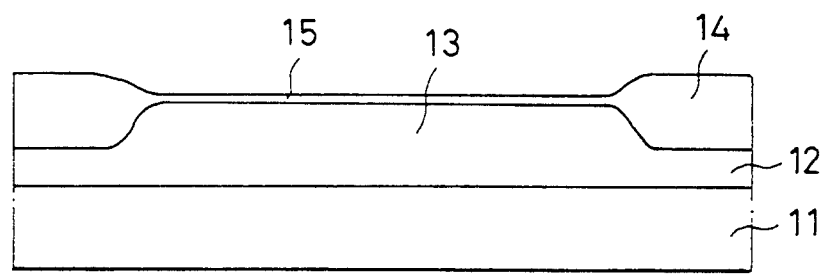
FIGS. 2a to 2i are sectional views illustrating a conventional method of making a DRAM device.
Figure 2B:
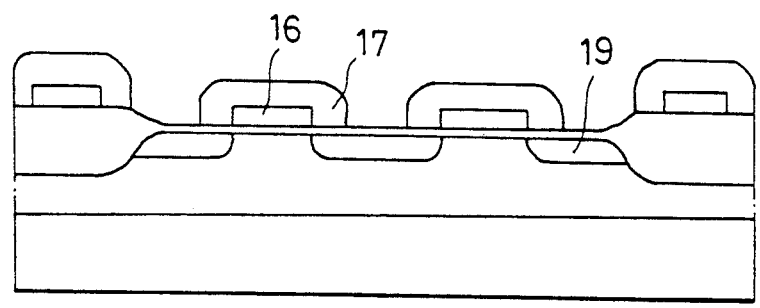
Figure 2C:
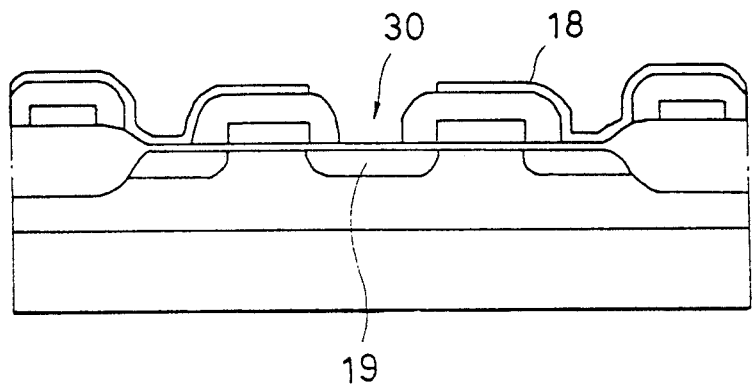
Figure 2D:
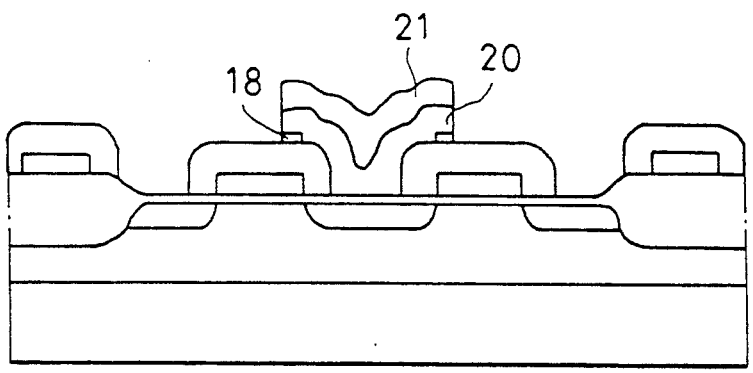
Figure 2E:
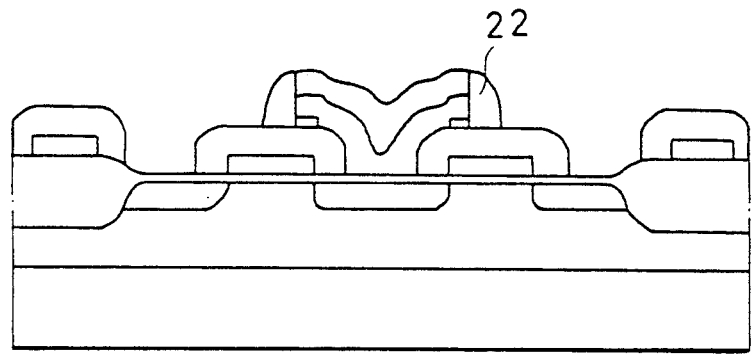
Figure 2F:
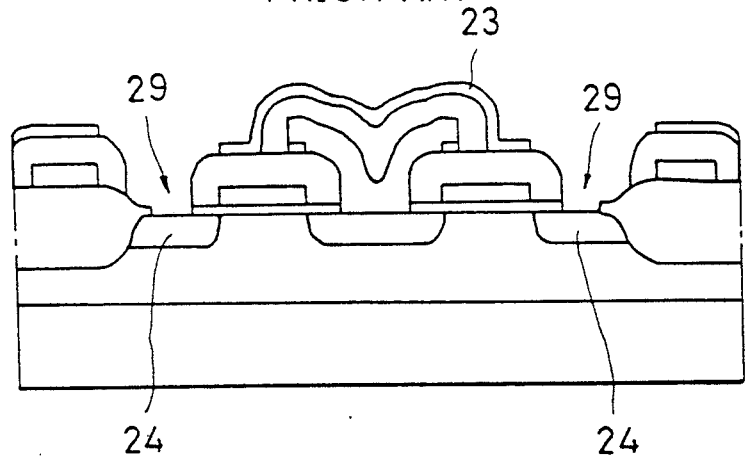
Figure 2G:
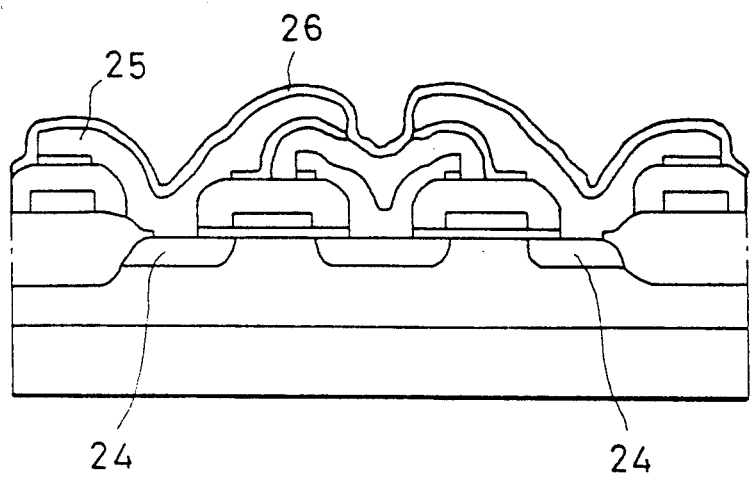
Figure 2H:
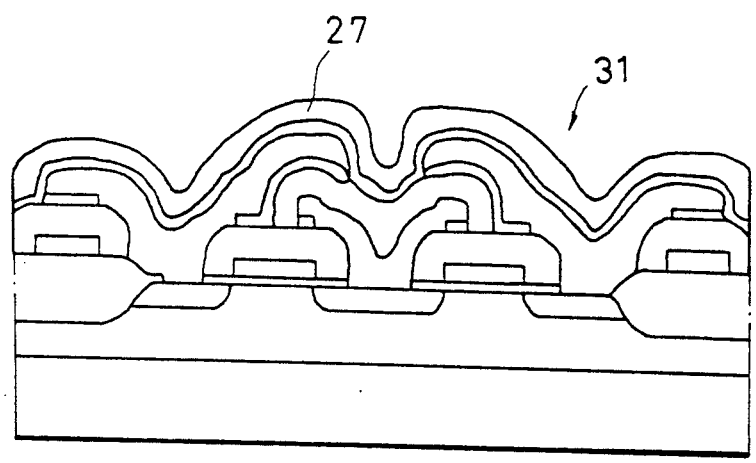
Figure 2I:
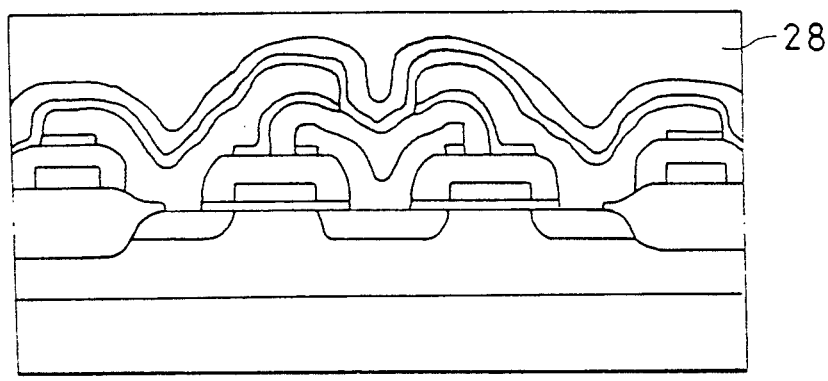
Figure 3A:
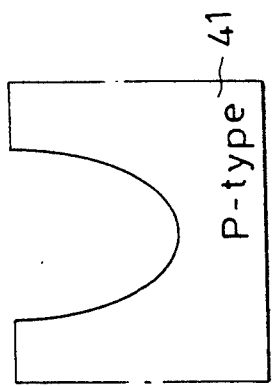
FIGS. 3a to 3i are sectional views illustrating a method of making a DRAM cell in accordance with a first embodiment of the present invention.

FIGS. 3a to 3i illustrate a method of making a DRAM cell in accordance with a first embodiment of the present invention. As shown in FIG. 3a, semiconductor substrate 41 of a first conductivity type (P type) doped with boron ions of the first conductivity type (P type) is first prepared as a plate electrode, as shown in FIG. 3a. P type semiconductor substrate 41 should have a sufficiently high concentration so as to serve as the plate electrode. In P type semiconductor substrate 41, a trench having a predetermined depth is then formed using a wet etching method. The material of P type semiconductor substrate 41 may include amorphous silicon or single crystalline silicon. For forming the trench, a magnetically enhanced reactive ion etching method preferably is used.

Figure 3B:
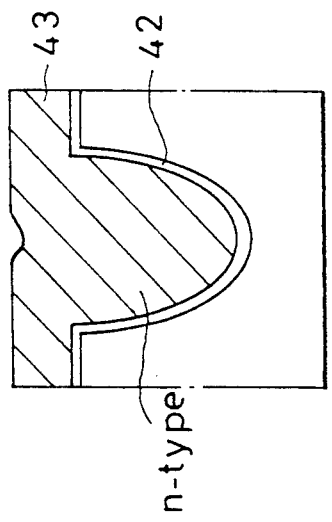

As shown in FIG. 3b, over the resultant exposed surfaces of P type semiconductor substrate 41 and the trench are deposited capacitor dielectric layer 42 and a second conductivity type (N type) material layer 43 (for example, a polysilicon layer doped with N type phosphorous ions) serving as a capacitor storage node electrode, in this order, by using one of the plasma enhanced chemical vapor deposition (PECVD) methods, a low pressure chemical vapor deposition (LPCVD) method or a chemical vapor deposition (CVD) method.

The deposition of N type material layer 43 is carried out such that layer 43 has an upper surface higher than that of P type semiconductor substrate 41, so as to cause the trench to be sufficiently filled with the N type material for achieving a surface smoothness. Capacitor dielectric layer 42 may comprise a silicon nitride film, a silicon oxide film, a double layered silicon nitride-silicon oxide film including a silicon oxide film and a silicon nitride film deposited over the silicon oxide film, or a triple layered silicon oxide-silicon nitride-silicon oxide film including a silicon oxide film, a silicon nitride film deposited over the silicon oxide film and another silicon oxide film deposited over the silicon nitride film.

In this embodiment, the preparation of P type semiconductor substrate 41 serving as the plate electrode is achieved by epitaxially-growing a silicon wafer, and then implanting and diffusing P type impurity ions such as boron ions into the silicon wafer. Alternatively, the implantation of boron ions may be carried out simultaneously with the epitaxial growth of the silicon wafer. This process is called an in-situ process.

The formation of N type material layer 43 is achieved by depositing a polysilicon layer on P type semiconductor substrate 41, and implanting and diffusing N type impurity ions such as phosphorous ions supplied from POCl$_3$ into the polysilicon layer. Alternatively, N type material layer 43 may be formed by carrying out the implantation of phosphorous ions simultaneously with the deposition of a polysilicon layer using an in-situ process. In place of the polysilicon, the N type material may include amorphous silicon or single crystalline silicon.

Figure 3C:
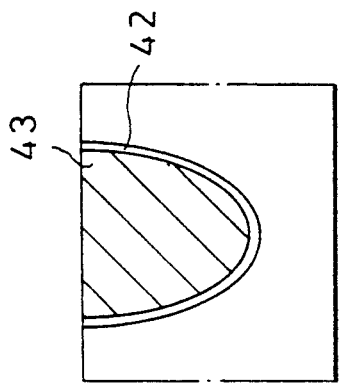

Thereafter, N type material layer 43 and capacitor dielectric layer 42 are etched back to expose the surface of P type semiconductor substrate 41, as shown in FIG. 3c.

Figure 3F:
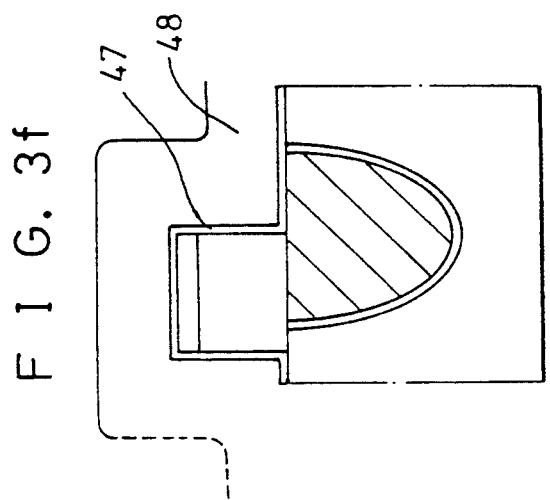
Figure 3E:
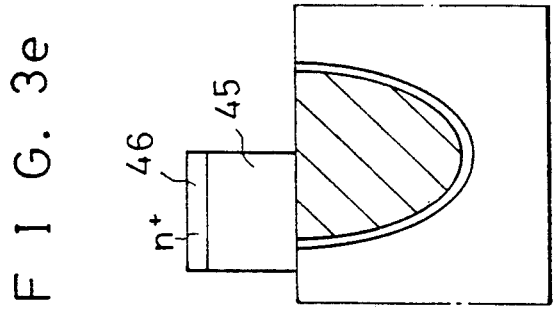
Figure 3D:
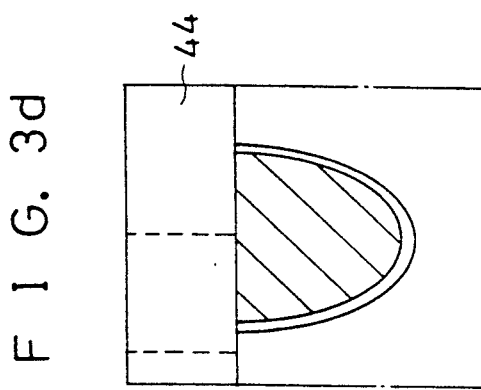

Over the resultant entire exposed surface, insulating layer 44 of a predetermined thickness is then deposited using a CVD method, as shown in FIG. 3d. Since the DRAM capacitor is provided with a gate electrode vertically arranged thereon in accordance with the present invention, the thickness of insulating layer 44 depends on the predetermined channel length. The material of insulating layer 44 may include silicon nitride or silicon oxide.

For forming an active region and the gate electrode, thereafter, insulating layer 44 is partially removed at its portions disposed over a part of the surface of P type semiconductor substrate 41 and about one half of the inlet portion of trench are removed, as shown in FIG. 3e. Subsequently, semiconductor layer 45 as an active layer is epitaxially-grown at a region corresponding to the removed portion of insulating layer 44. Otherwise, semiconductor layer 45 may be formed using a deposition method such as a CVD method. The material of semiconductor layer 45 may include amorphous silicon, single crystalline silicon or polycrystalline silicon. After removing the remaining portions of insulating layer 44, second conductivity type ions (namely, N type impurity ions such as phosphorous ions) are implanted into the surface of semiconductor layer 45 with a proper energy so that an N type bit line junction region 46 having a predetermined thickness is formed at the upper portion of semiconductor layer 45.

Over the resultant entire exposed surface are then deposited insulating film 47 for insulating the gate electrode and conductive material film 48 for the gate electrode, in this order, using a PECVD method, LPCVD method or CVD method, as shown in FIG. 3f. The material of insulating film 47 may include silicon nitride or silicon oxide, whereas the conductive material of film 48 may include chromium, molybdenum, aluminum, platinum, titanium or polycrystalline silicon doped with impurity ions.

Figure 3I:
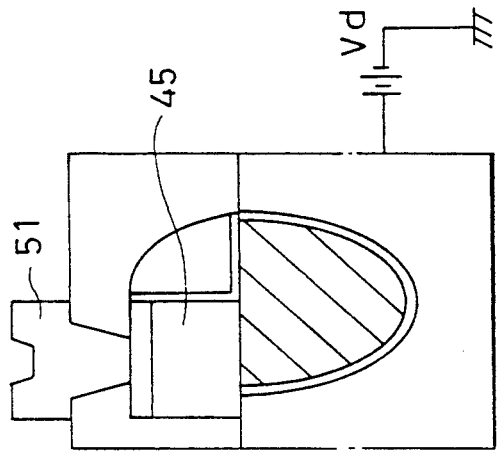
Figure 3H:
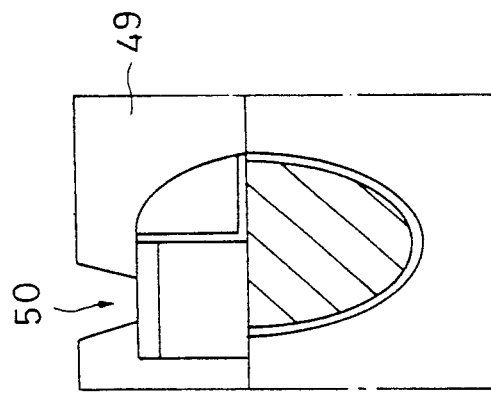
Figure 3G:
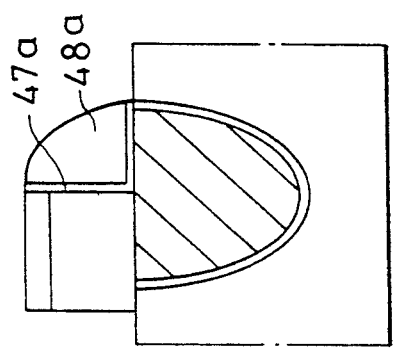

Thereafter, both insulating film 47 and conductive material film 48 are simultaneously subjected to photo and etching processes so that they are removed except for portions of insulating film 47 and conductive material film 48 disposed over about one half of the trench inlet portion not covered with semiconductor layer 45 and a portion of insulating film 47 deposited on a side wall of semiconductor layer 45 neighboring with such half of the trench inlet portion, as shown in FIG. 3g. As a result, gate insulating film 47a and side wall gate electrode 48a are formed at the side wall of semiconductor layer 45. In this case, the etching process used is a reactive ion etching (RIE) process, which is a type of dry etching process.

Over the resultant entire exposed surface, insulating layer 49 is then deposited using a CVD method to achieve surface smoothness, as shown in FIG. 3h. Thereafter, insulating layer 49 is subjected to photo and dry etching processes to form bit line contact 50 at N+ type bit line junction region 46.

Subsequently, bit line 51 is formed over bit line contact 50, as shown in FIG. 3i. On the other hand, a power source Vd is connected to P type semiconductor substrate 41 used as the plate electrode so that a predetermined voltage level is applied to P type semiconductor substrate 41 for operating the DRAM cell. Since gate electrode 48a is provided at the side walls of semiconductor layer 45, the thickness of semiconductor layer 45 corresponds to the predetermined channel length for transferring signal charge. Therefore, the thickness of insulating layer 44, which is used for defining semiconductor layer 45, should depend on the predetermined channel length.

Second Embodiment

Figure 4B:
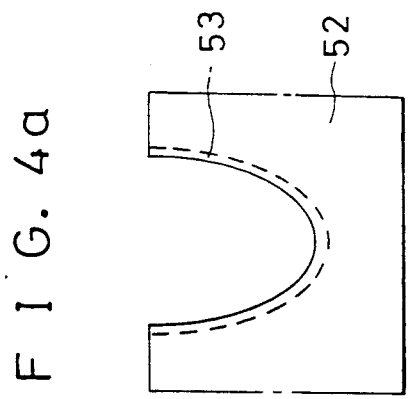
FIGS. 4a and 4b are sectional views illustrating a method of making a DRAM cell in accordance with a second embodiment of the present invention.
Figure 4A:
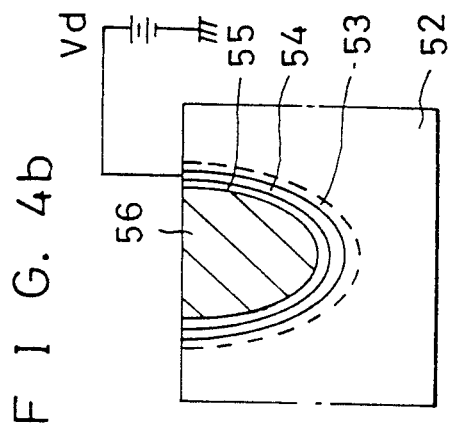

FIGS. 4a and 4b illustrate a method of making a DRAM cell in accordance with a second embodiment of the present invention. In accordance with this method, substrate 52 is first prepared in which a trench for forming a capacitor therein is formed, as shown in FIG. 4a. The material of substrate 52 may be an insulating material or a semiconductor material. The material may include amorphous silicon, polycrystalline silicon or single crystalline silicon. Thereafter, a trench having a predetermined depth is formed by dry or wet etching substrate 52. In FIG. 4a, the phantom line indicates insulating film 53, which is formed for insulating the capacitor in the trench from substrate 52 only when substrate 52 is made of a semiconductor material.

In the trench are deposited a film of the first conductivity material (for example, polysilicon doped with P type boron ions) as capacitor plate electrode 54, capacitor dielectric film 55 (for example, a double layered film including a silicon nitride film and a silicon oxide film) and a film of the second conductivity material (for example, polysilicon doped with N type phosphorous ions) as capacitor storage node electrode 56.

In this embodiment, materials and processes used in forming the capacitor are the same as those of the first embodiment. However, the second embodiment is different from the first embodiment in that the substrate is directly used as the plate electrode in the first embodiment, whereas the capacitor together with the plate electrode is formed in the trench in the second embodiment.

A power source Vd is connected to the plate electrode 54 so that a predetermined voltage level is applied to the plate electrode 54 for operating the DRAM cell. Other subsequent processes are the same as those of the first embodiment illustrated in FIGS. 3c to 3i, and so their detailed description is omitted here.

Third Embodiment

Figure 5:
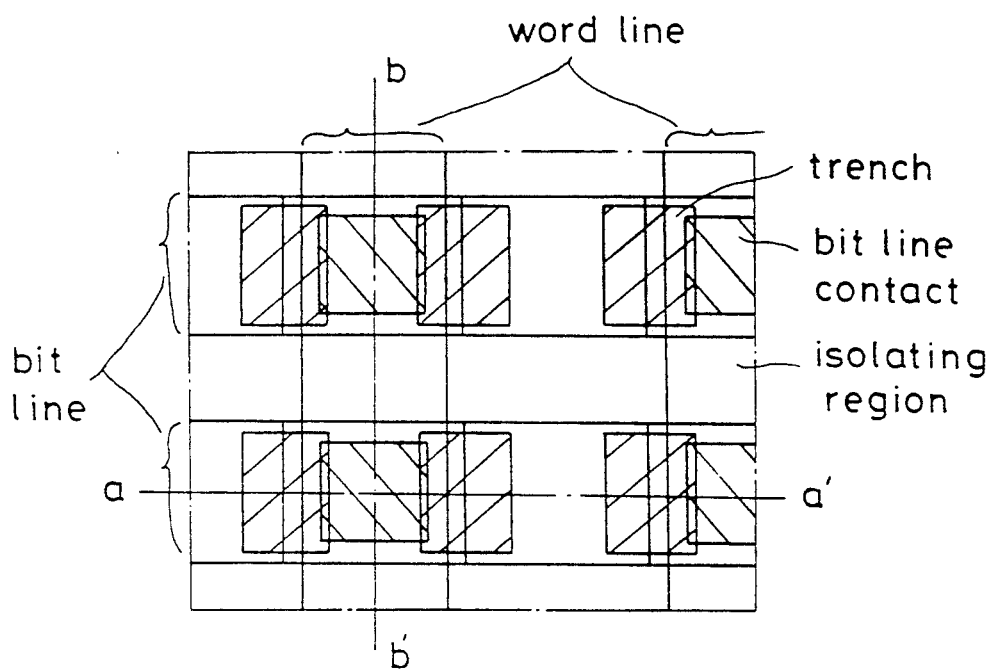
FIG. 5 is a layout diagram of a DRAM device made by a method in accordance with a third embodiment of the present invention.

FIG. 5 is a layout diagram of a DRAM device made by a method in accordance with a third embodiment of the present invention. FIGS. 6a to 6h are cross-sectional views taken along line a—a' of FIG. 5. FIGS. 7a to 7d are cross-sectional views taken along line b—b' of FIG. 5. On the other hand, FIG. 8a is a perspective view taken along line b—b' of FIG. 5, whereas FIG. 8b is a perspective view taken along line a—a' of FIG. 5.

The method of the DRAM device according to the third embodiment will now be described in conjunction with the above-mentioned drawings.

Figure 6A:
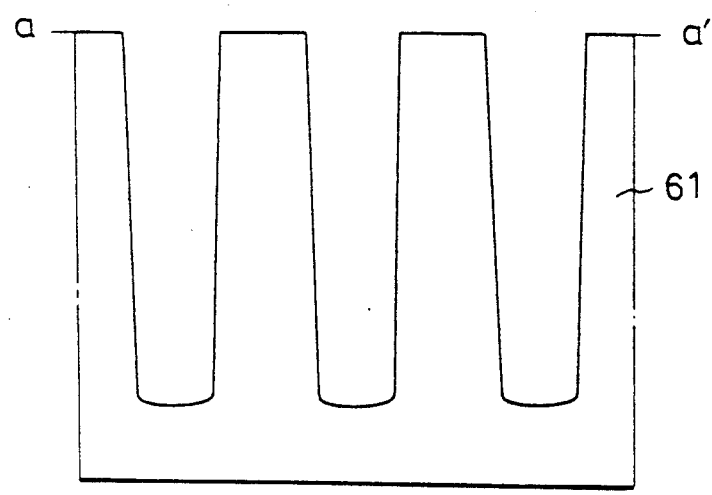
Figure 7A:
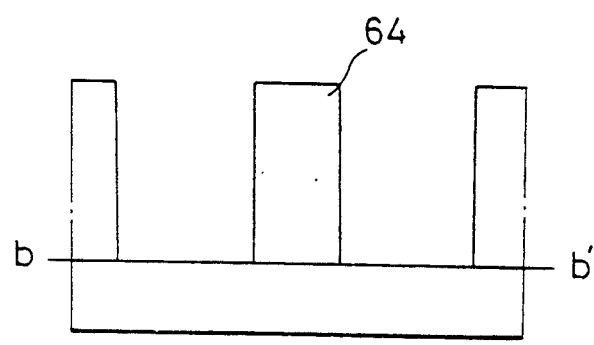
FIGS. 7a to 7d are cross-sectional views taken along line b—b' of FIG. 5.
Figure 7B:
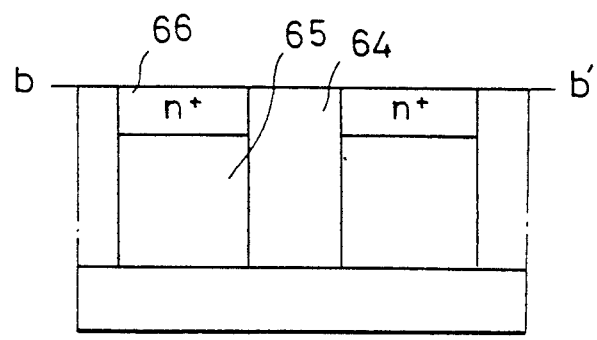

As shown in FIG. 6a, P type semiconductor substrate 61 as a plate electrode is prepared. Preferably, the material of P type semiconductor substrate 61 is polysilicon doped with boron ions of the first conductivity type, namely, P type. P type semiconductor substrate 61 should have a sufficiently high concentration to serve as the plate electrode. Thereafter, P type semiconductor substrate 61 is subjected to photo and etching processes so as to form a plurality of uniformly spaced trench pairs each having a predetermined depth. The etching process used is a magnetically enhanced reactive ion etching process, which is a type of dry etching process. In place of the polysilicon doped with P type impurity ions, the material of P type semiconductor substrate 61 may include amorphous silicon or single crystalline silicon.

Over the resultant exposed surfaces of P type semiconductor substrate 61 and all of the trenches are deposited capacitor dielectric layer 62 and second conductivity type (N type) material layer 63 (for example, polysilicon layer doped with N type phosphorous ions) serving as a capacitor storage node electrode, in this order, by using one of the PECVD, LPCVD and CVD methods, as shown in FIG. 6b.

The deposition of N type material layer 63 is carried out such that layer 63 has an upper surface higher than that of P type semiconductor substrate 61, so as to cause all the trench to be sufficiently filled with the N type material for achieving surface smoothness. Capacitor dielectric layer 62 may comprise a silicon nitride film, a silicon oxide film, a double layered silicon nitride-silicon oxide film including a silicon oxide film and a silicon nitride film deposited over the silicon oxide film, or a triple layered silicon oxide-silicon nitride-silicon oxide film including a silicon oxide film, a silicon nitride film deposited over the silicon oxide film and another silicon oxide film deposited over the silicon nitride film.

In this embodiment, the preparation of P type semiconductor substrate 61 serving as the plate electrode is achieved by epitaxially-growing a silicon wafer, and then implanting and diffusing P type impurity ions such as boron ions into the silicon wafer. Alternatively, the implantation of boron ions may be carried out simultaneously with the epitaxial growth of the silicon wafer by using an in-situ process.

The formation of N type material layer 63 is achieved by depositing a polysilicon layer on P type semiconductor substrate 61, and implanting and diffusing N type impurity ions such as phosphorous ions supplied from POCl$_3$ in the polysilicon layer. Alternatively, N type material layer 63 may be formed by carrying out the implantation of phosphorous ions simultaneously with the deposition of the polysilicon layer using an in-situ process. In place of the polysilicon, the N type material may include amorphous silicon or single crystalline silicon.

Thereafter, N type material layer 63 and capacitor dielectric layer 62 are etched back to expose the surface of P type semiconductor substrate 61, as shown in FIG. 6c. Over the resultant entire exposed surface, insulating layer 64 of a predetermined thickness is then deposited using a CVD method, as shown in FIG. 6c. Since the DRAM capacitor is provided with a gate electrode vertically arranged thereon in accordance with the present invention as mentioned above, the thickness of insulating layer 64 depends on the predetermined channel length. The material of insulating layer 64 may include silicon nitride or silicon oxide.

For forming an active region and the gate electrode, thereafter, insulating layer 64 is partially removed at its portions corresponding to regions at which bit lines cross word lines, as shown in FIG. 6c. Accordingly, the removed portions of insulating layer 64 are arranged such that they are uniformly spaced in both the direction that word lines extend and the direction that bit lines extend, as shown in FIGS. 6c and 7a. Each removed portion of insulating layer 64 extends approximately between centers of adjacent trench pairs in the direction that word lines extend. For achieving a high degree of integration in the DRAM device, it is preferred that the width d1 (FIG. 6c) of each removed portion of insulating layer 64 be equal to the width d2 (FIG. 6c) of each remaining portion of insulating layer 64.

Figure 6D:
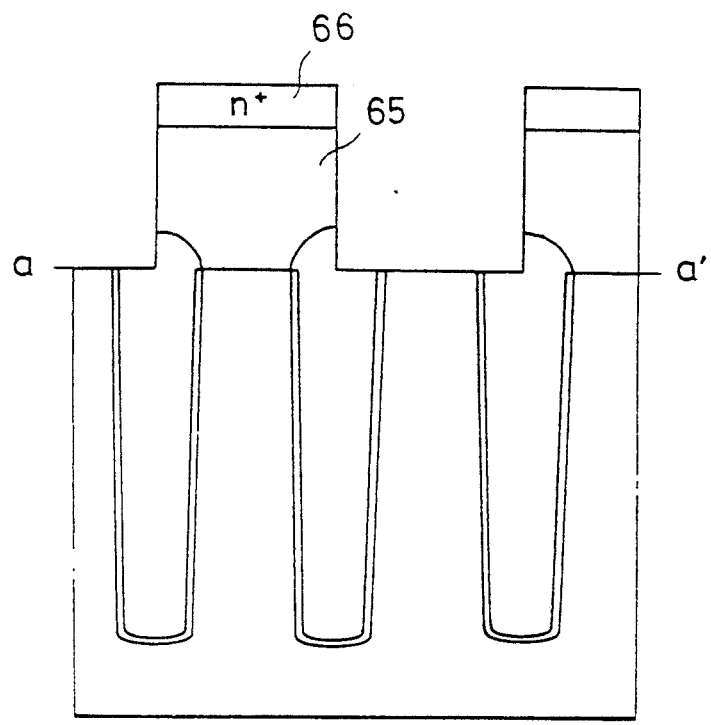

Subsequently, semiconductor layer 65 as an active layer is formed, which comprises a plurality of semiconductor layer portions epitaxially-grown at the regions corresponding to the removed portions of insulating layer 64, respectively, as shown in FIG. 6d. Otherwise, semiconductor layer 65 may be formed using a deposition method such as a CVD method. The material of semiconductor layer 65 may include amorphous silicon, single crystalline silicon or polycrystalline silicon. Thereafter, removal of certain of the remaining portions of insulating layer 64 is carried out, as illustrated in FIGS. 6d and 7b. At this time, the remaining portions of insulating layer 64 disposed at regions between adjacent bit line still remain for providing isolation between adjacent bit lines. That is, only the remaining portions of insulating layer 64 disposed at regions corresponding to the bit lines are removed. Then, high concentration second conductivity type ions (namely, N+ type impurity ions such as phosphorous ions) are implanted into the surface of each portion of semiconductor layer 65 with a proper energy so that N+ type bit line junction region 66 having a predetermined thickness is formed at the upper part of each portion of semiconductor layer 65.

Figure 6E:
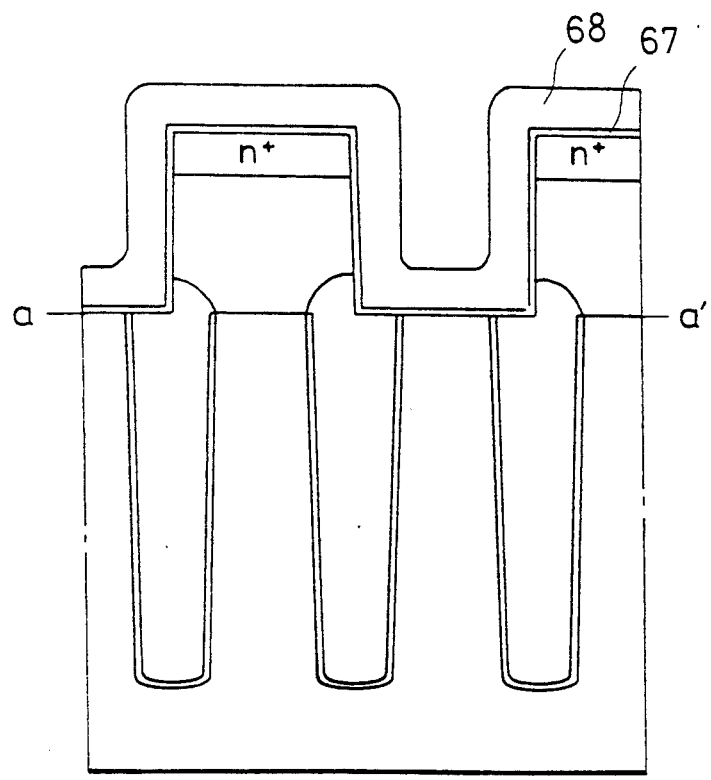

Over the resultant entire exposed surface are then deposited insulating film 67 for insulating the gate electrodes and conductive material film 68 for the gate electrodes, in this order, using a PECVD, LPCVD or CVD method, as illustrated in FIG. 6e. The material of insulating film 67 may include silicon nitride or silicon oxide, whereas the conductive material of film 68 may include chromium, molybdenum, aluminum, platinum, titanium or polycrystalline silicon doped with impurity ions.

Figure 6F:
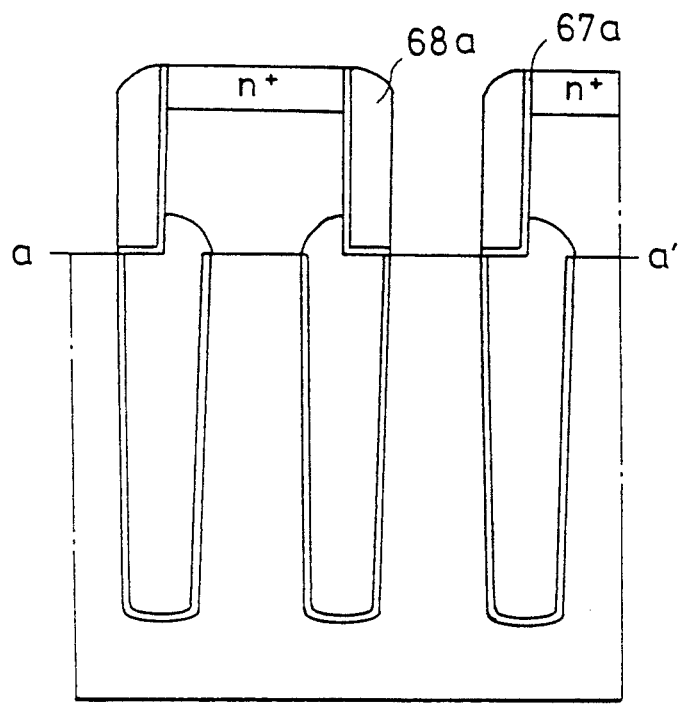

Thereafter, both insulating film 67 and conductive material film 68 are simultaneously subjected to photo and etching processes so that such films are removed except for portions of insulating film 67 and conductive material film 68 disposed over about one half of each trench inlet portion not covered with semiconductor layer 65 and portions of insulating film 67 deposited on side walls of each portion of the semiconductor layer 65, as shown in FIG. 6f. As a result, gate insulating films 67a and side wall gate electrodes 68a are formed at side walls of each portion of semiconductor layer 65. In this case, the etching process used is an RIE process, which is a type of dry etching process.

Figure 6G:
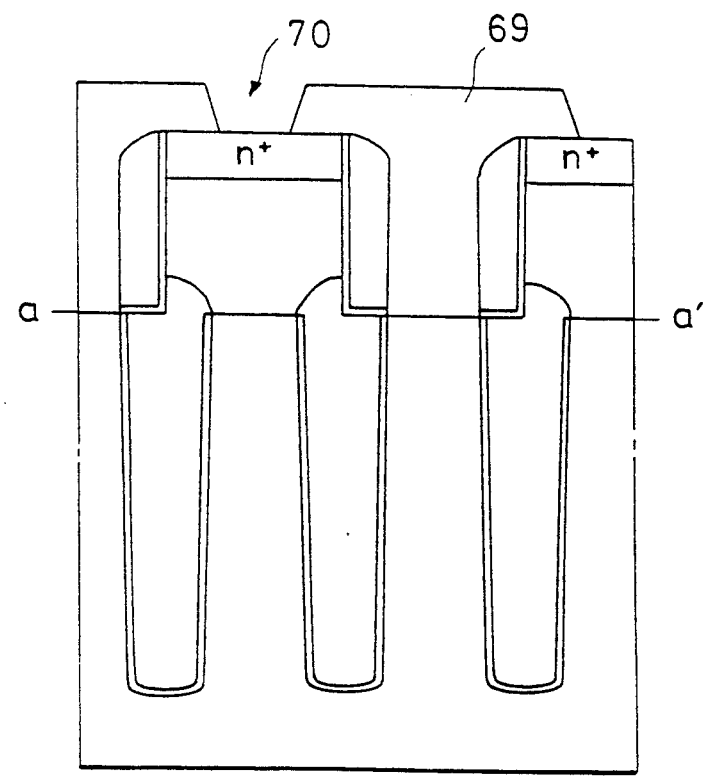
Figure 7C:
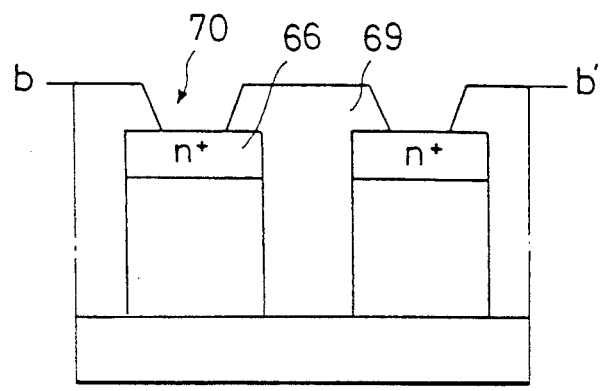
Figure 8A:
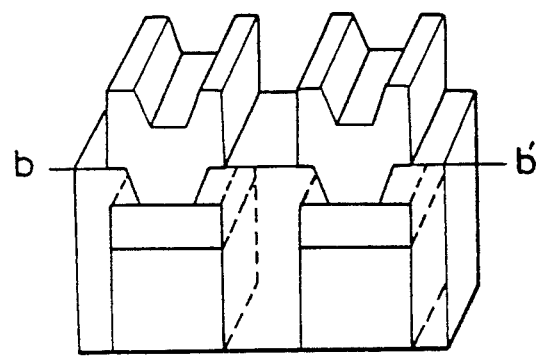
FIG. 8a is a perspective view taken along line a—a' of FIG. 5.
Figure 8B:
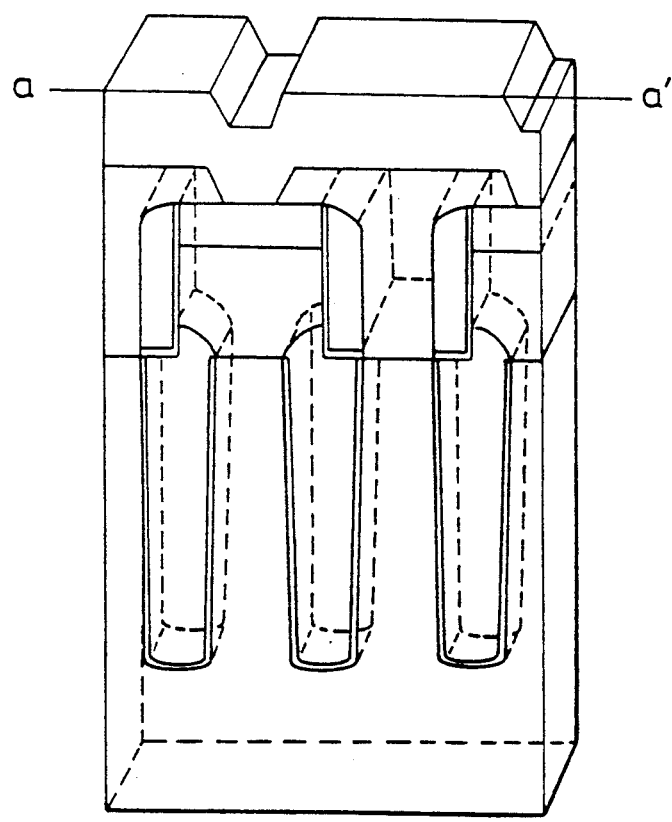
FIG. 8b is a perspective view taken along line b—b' of FIG. 5.

Over the resultant entire exposed surface, insulating layer 69 is then deposited using a CVD method to achieve a surface smoothness, as shown in FIGS. 6g and 7c. Thereafter, insulating layer 69 is subjected to photo and dry etching processes, to form bit line contact 70 at each N+ type bit line junction region 66.

Figure 6H:
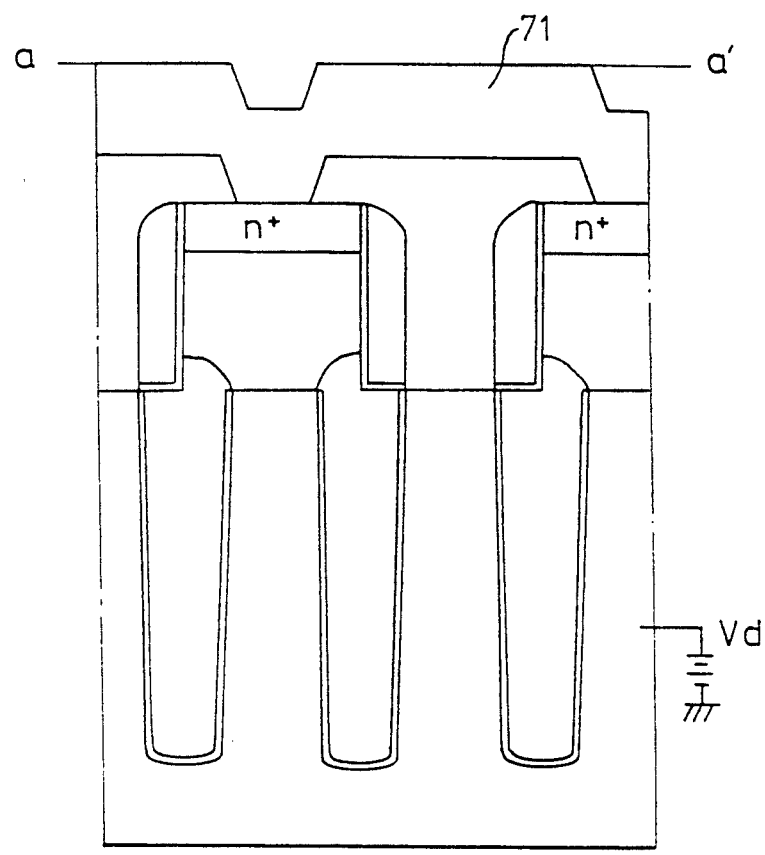
Figure 7D:
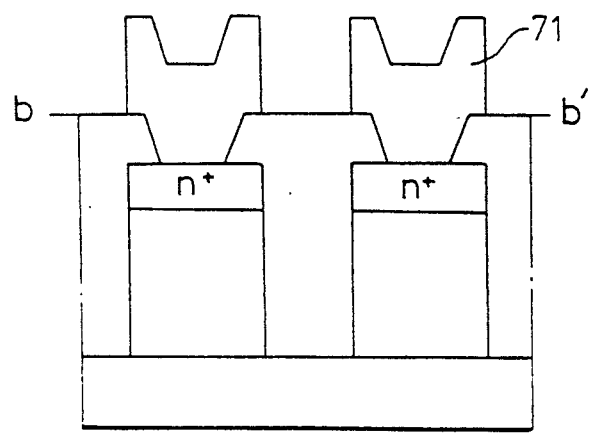

Subsequently, bit lines 71 are formed to extend over bit line contact 70, as shown in FIGS. 6h and 7d. On the other hand, a power source Vd is connected to P type semiconductor substrate 61 used as the plate electrode so that a predetermined voltage level is applied to P type semiconductor substrate 61 for operating the DRAM device. Since gate electrodes 68a are provided at the side walls of each portion of semiconductor layer 65, the thickness of each portion of semiconductor layer 65 corresponds to the predetermined channel length for transferring signal charge. Therefore, the thickness of insulating layer 64, which is used for defining each portion of semiconductor layer 45, should depend on the predetermined channel length.

Fourth Embodiment

Figure 9A:
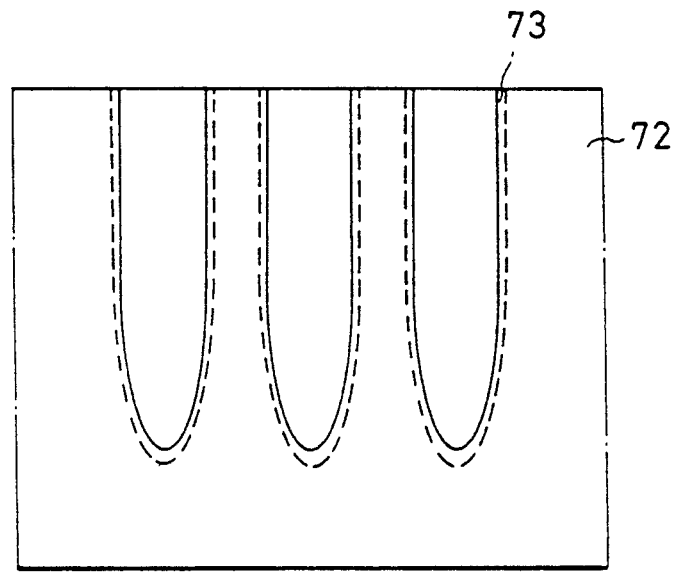
FIGS. 9a and 9b are sectional views illustrating a method of making a DRAM cell in accordance with a fourth embodiment of the present invention.
Figure 9B:
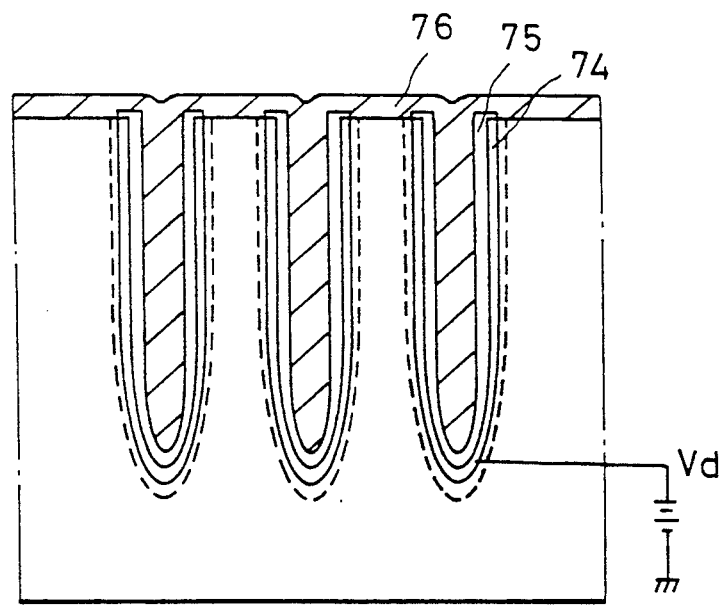

FIGS. 9a and 9b illustrate a method of making a DRAM cell in accordance with a fourth embodiment of the present invention. In accordance with this method, substrate 72 is first prepared in which a plurality of uniformly spaced trench pairs each having a predetermined depth are formed, as shown in FIG. 9a. The material of substrate 72 may be an insulating material or a semiconductor material. The material may include amorphous silicon, polycrystalline silicon or single crystalline silicon. Thereafter, a plurality of uniformly spaced trench pairs each having a predetermined depth are formed by dry or wet etching substrate 72. In FIG. 9a, the phantom line indicates insulating film 73, which is formed for insulating the capacitor in each trench from the substrate 72 only when substrate 72 is made of a semiconductor material.

In each trench are deposited a film of the first conductivity material (for example, polysilicon doped with P type boron ions) as capacitor plate electrode 74, capacitor dielectric film 75 (for example, a double layered film including a silicon nitride film and a silicon oxide film) and a film of the second conductivity material (for example, polysilicon doped with N type phosphorous ions) as capacitor storage node electrode 76.

In this embodiment, materials and processes used in forming the capacitor are the same as those of the third embodiment. However, the fourth embodiment is different from the third embodiment in that the substrate is directly used as the plate electrode in the third embodiment, whereas the constituting elements of the capacitor together with the plate electrode are formed in each trench in the fourth embodiment.

A power source Vd is connected to plate electrodes 74 so that a predetermined voltage level is applied to plate electrodes 74 for operating the DRAM device. Other subsequent processes are the same as those of the third embodiment illustrated in FIG. 6b and FIGS. 7a to 7d, and so their detailed description is omitted here.

As apparent from the above description, the present invention provides the following effects.

First, the method of making a DRAM device having the above-mentioned cell structure according to the present invention involves processes simpler than those of the methods of making DRAM devices having conventional stacked capacitor structures.

Second, the memory cell structure of the present invention does not have a horizontal arrangement, but instead a vertical arrangement, so that the area occupied by each memory cell is greatly reduced. Accordingly, there is an advantage in terms of the design rule. It also is possible to easily make memory devices having a high degree of integration.

Third, in making a memory device, isolation between adjacent active regions can be achieved without formation of an insulating layer.

Although the preferred embodiments of the invention have been disclosed for illustrative purpose, those skilled in the art will appreciate that various modifications, additions and substitutions are possible, without departing from the scope and spirit of the invention as disclosed in the accompanying claims.

What is claimed is:

1. A method of making a semiconductor memory cell comprising the steps of:
    preparing a semiconductor substrate of a first conductivity type as a plate electrode for a capacitor;
    forming a trench having an inlet in the first conductivity type semiconductor substrate;
    forming a capacitor dielectric layer and a conductive material layer of a second conductivity type as a storage node electrode over the surface of the trench, the capacitor dielectric and conductive material layers filling the trench;
    forming a semiconductor layer as an active layer over a portion of the surface of the semiconductor substrate and a portion of the inlet of the trench, the semicondctor layer having opposite side walls;
    implanting impurity ions of the second conductivity type into the surface of the semiconductor layer to form a bit line junction region;
    forming a first insulating layer for providing insulation for a gate electrode over the portions of the inlet of the trench not covered with the semiconductor layer and along the side wall of the semiconductor layer neighboring the portion of the inlet of the trench not covered with the semiconductor layer;
    forming a side wall gate electrode over the first insulating layer such that it extends vertically perpendicular to the inlet of the trench;
    forming a second insulating layer over the resultant entire exposed surface and patterning the second insulating layer to form a bit line contact at the bit line junction region; and
    forming a bit line over the bit line contact.

2. A method of making a semiconductor memory cell in accordance with claim 1, wherein the first conductivity type semiconductor substrate comprises a material selected from a group consisting of single crystalline silicon, amorphous silicon and polysilicon doped with first conductivity impurity ions.

3. A method of making a semiconductor memory cell in accordance with claim 2, wherein the first conductivity type semiconductor substrate is prepared by epitaxially-growing a silicon wafer, and then implanting and diffusing high concentration impurity ions of the first conductivity type into the silicon wafer.

4. A method of making a semiconductor memory cell in accordance with claim 2, wherein the first conductivity type semiconductor substrate is prepared by epitaxially-growing a silicon wafer and simultaneously implanting and diffusing high concentration impurity ions of the first conductivity type into the silicon wafer.

5. A method of making a semiconductor memory cell in accordance with claim 1, wherein the step of forming the capacitor dielectric layer and the storage node electrode comprises the steps of:
    forming the capacitor dielectric layer over the entire exposed surface;
    forming the second conductivity type material layer for the storage node electrode such that it has an upper surface higher than that of the first conductivity type semiconductor substrate, whereby the trench is filled with the second conductivity type material; and
    etching back the second conductivity type material layer and the capacitor dielectric layer to expose the surface of the first conductivity type semiconductor substrate.

6. A method of making a semiconductor memory cell in accordance with claim 5, wherein the second conductivity type material layer for the storage node electrode comprises polysilicon.

7. A method of making a semiconductor memory cell in accordance with claim 6, wherein the second conductivity type material layer is formed by depositing a polysilicon layer, and then implanting and diffusing impurity ions of the second conductivity type into the polysilicon layer.

8. A method of making a semiconductor memory cell in accordance with claim 6, wherein the second conductivity type material layer is formed by depositing a polysilicon layer and simultaneously implanting and diffusing impurity ions of the second conductivity type into the polysilicon layer.

9. A method of making a semiconductor memory cell in accordance with claim 5, wherein the capacitor dielectric layer is selected from a group consisting of a silicon oxide film, a silicon nitride film, a double layered film including a silicon oxide film and a silicon nitride film, and a triple layered film including a silicon oxide film, a silicon nitride film and another silicon oxide film.

10. A method of making a semiconductor memory cell in accordance with claim 1, wherein the step of forming the semiconductor layer as the active layer comprises the steps of:
    forming an insulating layer over the entire exposed surface;
    patterning the insulating layer so that the insulating layer is partially removed at portions disposed over an edge portion of the inlet of the trench filled with the second conductivity type material and over an adjacent portion of the surface of the semiconductor substrate; and
    forming the semiconductor layer in the regions where the insulating layer has been removed.

11. A method of making a semiconductor memory cell in accordance with claim 10, wherein the material of the semiconductor layer comprises a material selected from a group consisting of single crystalline silicon, amorphous silicon and polysilicon.

12. A method of making a semiconductor memory cell in accordance with claim 10, wherein the semiconductor layer is formed by an epitaxial growth method.

13. A method of making a semiconductor memory cell in accordance with claim 10, wherein the semiconductor layer is formed by a chemical vapor deposition method.

14. A method of making a semicondcutor memory cell in accordance with claim 10, wherein the side wall gate electrode has a particular channel length, and wherein the insulating layer has a thickness corresponding to the particular channel length.

15. A method of making a semiconductor memory cell in accordance with claim 10, wherein the insulating layer comprises silicon nitride or silicon oxide.

16. A method of making a semiconductor memory cell in accordance with claim 1, wherein the semiconductor layer covers about one half of the trench inlet.

17. A method of making a semiconductor memory cell in accordance with claim 1, wherein the formation of the first insulating layer for providing the insulation of the gate electrode and the formation of the side wall gate electrode are achieved by the steps of:
    forming an insulating layer and a second conductive material layer; and
    patterning both the insulating layer and the second conductive material layer so that such layers are removed except for portions disposed over the portion of the inlet of the trench not covered with the semiconductor layer and along the side wall of the semiconductor layer neighboring the portion of the inlet of the trench not covered with the semiconductor layer.

18. A method of making a semiconductor memory cell in accordance with claim 17, wherein the second conductive material layer for the gate electrode comprises metal or polysilicon doped with impurity ions.

19. A method of making a semiconductor memory cell in accordance with claim 17, wherein the patterning process is a dry etching process.

20. A method of making a semiconductor memory cell in accordance with claim 19, wherein the dry etching process is a reactive ion etching process.

21. A method of making a semiconductor memory cell in accordance with claim 1, wherein a power source is connected to the first conductivity type semiconductor substrate serving as the capacitor plate electrode so that a voltage level is applied to the semiconductor substrate.

22. A method of making a semiconductor memory cell comprising the steps of:
    preparing a substrate;
    forming a trench having an inlet in the substrate;
    forming a conductive material layer of a first conductivity type as a capacitor plate electrode, a capacitor dielectric layer and a conductive material layer of a second conductivity type as a storage node electrode over the surface of the trench, the layers filling the trench,
    forming a semiconductor layer as an active layer over a portion of the surface of the semiconductor substrate and a portion of the inlet of the trench, the semiconductor layer having opposite side walls;
    implanting impurity ions of the second conductivity type into the surface of the semiconductor layer to form a bit line junction region;
    forming a first insulating layer for providing insulation for a gate electrode over the portion of the inlet of the trench not covered with the semiconductor layer and along the side wall of the semiconductor layer neighboring the portion of the inlet of the trench not covered with the semiconductor layer;
    forming a side wall gate electrode over the first insulating layer such that it extends perpendicularly to the inlet of the trench;
    forming a second insulating layer over the resultant entire exposed surface and patterning the second insulating layer to form a bit lien contact at the bit lien junction region; and
    forming a bit lien over the entire exposed surface.

23. A method of making a semiconductor memory cell in accordance with claim 22, wherein the substrate comprises a semiconductor material.

24. A method of making a semiconductor memory cell in accordance with claim 23, wherein the semiconductor material comprises a material selected from the group consisting of single crystalline silicon, polycrystalline silicon and amorphous silicon.

25. A method of making a semiconductor memory cell in accordance with claim 22, wherein the substrate comprises an insulating material.

26. A method of making a semiconductor memory cell in accordance with claim 23 further comprising the step of forming an insulating film over the surface of the trench prior to the formation of the capacitor.

27. A method of making a semiconductor memory cell in accordance with claim 22, wherein the conductive material of the capacitor plate electrode comprises polysilicon of the first conductivity type.

28. A method of making a semiconductor memory cell in accordance with claim 22, wherein the conductive material of the storage node electrode comprises polysilicon of the second conductivity type.

29. A method of making a semiconductor memory cell in accordance with claim 22, wherein the step of forming the first conductivity type material layer as the capacitor plate electrode comprises the steps of:
   depositing a semiconductor layer, and
   implanting and diffusing impurity ions of the first conductivity type into the semiconductor layer.

30. A method of making a semiconductor memory cell in accordance with claim 22, wherein the first conductivity type material layer as the capacitor plate electrode is formed by depositing a semiconductor layer and simultaneously implanting and diffusing impurity ions of the first conductivity type into the semiconductor layer.

31. A method of making a semiconductor memory cell in accordance with claim 22, wherein the step of forming the second conductivity type material layer as the storage node electrode comprises the steps of:
   depositing a semiconductor layer; and
   implanting and diffusing impurity ions of the second conductivity type into the semiconductor layer.

32. A method of making a semiconductor memory cell in accordance with claim 22, wherein the second conductivity type material layer as the storage node electrode is formed by depositing a semiconductor layer and simultaneously implanting and diffusing impurity ions of the second conductivity type into the semiconductor layer.

33. A method of making a semiconductor memory cell in accordance with claim 22, wherein a power source is connected to the first conductivity type material layer serving as the capacitor plate electrode so that a voltage level is applied to the first conductivity type material layer.

34. A method of making a semiconductor memory device comprising the steps of:
   preparing a semiconductor substrate of a first conductivity type as a plate electrode for a capacitor;
   forming a plurality of uniformly spaced trench pairs in the first conductivity type semiconductor substrate, each trench pair including a pair of spaced trenches, each trench having an inlet in the semiconductor substrate;
   forming a capacitor dielectric layer and a conductive material layer of a second conductivity type as a storage node electrode over the surface of each trench, the capacitor dielectric and conductive material layers filling each trench;
   forming a first insulating layer over the resultant entire exposed surface and removing portions of the first insulating layer, the removed portions being disposed over a region extending from a part of one trench of a pair of trenches to a part of the other trench in the pair of trenches in a direction that bit lines are to extend;
   forming a semiconductor layer as an active layer over regions corresponding to the removed portions of the first insulating layer, and removing selectively the remaining portions of the first insulating layer, the semiconductor layer comprising a plurality of semiconductor portions each having opposite side walls;
   implanting high concentration impurity ions of the second conductivity type into the surface of the portions of the semiconductor layer to form bit line junction regions at the upper part of each semiconductor layer portion;
   forming a second insulating layer for providing insulation for gate electrodes over the portions of the inlet of each trench not covered with a semiconductor layer portion;
   forming side wall gate electrodes over the second insulating layer such that a side wall gate electrode extends perpendicularly to the inlet of each corresponding trench;
   forming a third insulating layer over the resultant entire exposed surface and patterning the third insulating layer to form a bit line contact at each bit line junction region; and
   forming a bit lien over each bit line contact.

35. A method of making a semiconductor memory device in accordance with claim 34, wherein the first conductivity type semiconductor substrate comprises a material selected from a group consisting of single crystalline silicon, amorphous silicon and polysilicon doped with first conductivity impurity ions.

36. A method of making a semiconductor memory device in accordance with claim 35, wherein the first conductivity type semiconductor substrate is prepared by epitaxially-growing a silicon wafer, and then implanting and diffusing high concentration impurity ions of the first conductivity type into the silicon wafer.

37. A method of making a semiconductor memory device in accordance with claim 35, wherein the first conductivity type semiconductor substrate is prepared by epitaxially growing a silicon wafer and simultaneously implanting and diffusing high concentration impurity ions of the first conductivity type into the silicon wafer.

38. A method of making a semiconductor memory device in accordance with claim 34, wherein the step of forming the capacitor dielectric layer and the storage node electrode comprises the steps of:
   forming the capacitor dielectric layer over the entire exposed surface;
   forming the second conductivity type material layer for the storage node electrode such that it has an upper surface higher than that of the first conductivity type semiconductor substrate, wherein each trench is filled with the second conductivity type material; and
   etching back the second conductivity type material layer and the capacitor dielectric layer to expose the surface of the first conductivity type semiconductor substrate.

39. A method of making a semiconductor memory device in accordance with claim 38, wherein the second conductivity type material layer for the storage node electrode comprises polysilicon.

40. A method of making a semiconductor memory device in accordance with claim 39, wherein the second conductivity type material layer is formed by depositing a polysilicon layer, and then implanting and diffusing impurity ions of the second conductivity type into the polysilicon layer.

41. A method of making a semiconductor emory device in accordance with claim 39, wherein the second conductivity type material layer is formed by depositing a polysilicon layer and simultaneously implanting and diffusing impurity ions of the second conductivity type into the polysilicon layer.

42. A method of making a semiconductor memory device in accordance with claim 38, wherein the capacitor dielectric layer comprises a material selected from a group consisting of a silicon oxide film, a silicon nitride film, a double layered film including a silicon oxide film and a silicon nitride film, and a triple layered film including a silicon oxide film, and silicon nitride film and another silicon oxide film.

43. A method of making a semiconductor memory device in accordance with claim 34 wherein the step of forming the semiconductor layer as the active layer comprises the steps of:
   forming an insulating layer over the entire exposed surface;
   pattering the insulating layer so that the insulating layer is partially removed at portions disposed over a region extending from a part of one trench of a pair of trenches to a part of the other trench of the pair of trenches in a direction that bit lines are to extend; and
   forming the semiconductor layer such that each semiconductor layer portion is disposed over the region corresponding to each of removed portions of the insulating layer.

44. A method of making a semiconductor memory device in accordance with claim 43, wherein the material of the semiconductor layer comprises a material selected from a group consisting of single crystalline silicon, amorphous silicon and polysilicon.

45. A method of making a semiconductor memory device in accordance with claim 43, wherein the semiconductor layer is formed by an epitaxial growth method.

46. A method of making a semiconductor memory device in accordance with claim 43, wherein the semiconductor layer is formed by a chemical vapor deposition method.

47. A method of making a semiconductor memory device in accordance with claim 43, wherein the insulating layer has a thickness corresponding to he channel length of the side wall gate electrodes.

48. A method of making a semiconductor memory device in accordance with claim 43, wherein the material of the insulating layer comprises silicon nitride of silicon oxide.

49. A method of making a semiconductor memory device in accordance with claim 34, wherein the semiconductor layer covers about one half of each trench inlet.

50. A method of making a semiconductor memory device in accordance with claim 34, wherein the formation of the second insulating layer for providing the insulation of the gate electrodes and the formation of the gate electrodes are achieved by the steps of:
   forming an insulating layer over the entire exposed surface;
   forming a conductive material layer for the gate electrodes; and
   patterning the insulating layer and the conductive material layer so that such layers are removed except for portions disposed over the other inlet part of each trench not covered with the semiconductor layer and on the side walls of each portion of the semiconductor layer.

51. A method of making a semiconductor memory device in accordance with claim 50, wherein the conductive material for the gate electrode comprises metal or polysilicon doped with impurity ions.

52. A method of making a semiconductor memory device in accordance with claim 50, wherein the patterning process is a dry etching process.

53. A method of making a semiconductor memory device in accordance with claim 52, wherein the dry etching process is a reactive ion etching process.

54. A method of making a semiconductor memory device in accordance with claim 34, wherein a power source is connected to the first conductivity type semiconductor substrate serving as the capacitor plate electrode so that a voltage level is applied to the semiconductor substrate.

55. A method of making a semiconductor memory device in accordance with claim 34, wherein the widths of each portion of the semiconductor layer are equal to the widths of the removed portions of the first insulating layer.

56. A method of making a semiconductor memory device in accordance with claim 34, wherein the step of removing selectively the remaining portions of the first insulating layer is carried out so that the portions of the first insulating layer disposed within the bit lines are removed while the portions of the first insulating layer disposed between adjacent bit lines are not removed.

57. A method of making a semiconductor memory device comprising the steps of:
   preparing a substrate;
   forming a plurality of uniformly spaced trench pairs in the substrate, each trench pair including a pair of spaced trenches, each trench having an inlet;
   forming a semiconductor layer of a first conductivity type as a plate electrode, a capacitor dielectric layer and a semiconductor layer of a second conductivity type as a storage node electrode over the surface of each trench, the layers filling each trench;
   forming a first insulating layer over the resultant entire exposed surface and removing portions of the first insulating layer, the removed portion being disposed over a region extending from a part of one trench of a pair of trenches to a part of the other trench of the pair of trenches in a direction that bit lines are to extend;
   forming a semiconductor layer as an active layer over regions corresponding to the removed portion of the first insulating layer, and removing selectively the remaining portions of the first insulating layer, the semiconductor layer comprising a plurality of semiconductor portions each having opposite aisw walls;
   implanting impurity ions of the second conductivity type into he surface of the portions of the semiconductor layer to form bit line junction regions at the upper part of each semiconductor layer portion;
   forming a second insulating layer for providing insulation for gate electrodes over the portions of the inlet of each trench not covered with a semiconductor layer portion and on the side walls of each semiconductor layer portion;
   forming side wall gate electrodes over the second insulating layer such that a side wall gate electrode extends perpendicularly to the inlet of each corresponding trench;
   forming a third insulating layer over the resultant entire exposed surface and patterning the third insulating layer to form a bit line contact at each bit line junction region; and forming a bit line over each bit line contact.

58. A method of making a semiconductor memory device in accordance with claim 57, wherein the substrate comprises a semiconductor material.

59. A method of making a semiconductor memory device in accordance with claim 58, wherein the semiconductor material comprises a material selected from the group consisting of single crystalline silicon, polycrystalline silicon and amorphous silicon.

60. A method of making a semiconductor memory device in accordance with claim 57, wherein the substrate comprises an insulating material.

61. A method of making a semiconductor memory device in accordance with claim 57, further comprising the step of forming an insulating film over the surface of the trench prior to the step of forming a semiconductor layer of the first conductivity type as a plate electrode.

62. A method of making a semiconductor memory device in accordance with claim 57, wherein the semiconductor layer of the plate electrode comprises polysilicon of the first conductivity type.

63. A method of making a semiconductor memory device in accordance with claim 57, wherein the step of forming the first conductivity type semiconductor layer as the plate electrode comprises the steps of:

depositing a semiconductor layer, and implanting and diffusing impurity ions of the first conductivity type into the semiconductor layer.

64. A method of making a semiconductor memory device in accordance with claim 57, wherein the semiconductor layer of the storage node electrode comprises polysilicon of the second conductivity type.

65. A method of making a semiconductor memory device in accordance with claim 57, wherein the semiconductor layer of the plate electrode is formed by depositing a semiconductor layer and simultaneously implanting and diffusing impurity ions of the first conductivity type into the semiconductor layer.

66. A method of making a semiconductor memory device in accordance with claim 57, wherein the step of forming the semiconductor layer as the storage node electrode comprises the steps of:

depositing a semiconductor layer, and implanting and diffusing impurity ions of the second conductivity type into the semiconductor layer.

67. A method of making a semiconductor memory device in accordance with claim 57, wherein the semiconductor layer of the storage node electrode is formed by depositing a semiconductor layer and simultaneously implanting and diffusing impurity ions of the second conductivity type into the semiconductor layer.

68. A method of making a semiconductor memory device in accordance with claim 57, wherein a power source is connected to the first conductivity type semiconductor layer serving as the plate electrode so that a voltage level is applied to the first conductivity type semiconductor layer.

69. A method of making a semiconductor memory device in accordance with claim 57, wherein the widths of each portion of the semiconductor layer is equal to the width of the removed portions of the first insulating layer.

70. A method of making a semiconductor memory device in accordance with claim 57, wherein the step of removing selectively the remaining portions of the first insulating layer is carried out so that the portions of the first insulating layer disposed within the bit lines are removed while the portions of the first insulating layer disposed between adjacent bit lines are not removed.

* * * * *